(12) United States Patent
Choksi et al.

(10) Patent No.: US 9,628,031 B2
(45) Date of Patent: Apr. 18, 2017

(54) TRANSFORMER FEEDBACK AMPLIFIER (71) Applicant: QUALCOMM Incorporated, San Diego, CA (US)

(72) Inventors: Ojas Mahendra Choksi, San Diego, CA (US); Bin Fan, San Diego, CA (US); Bassel Hanafi, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/643,640

(22) Filed: Mar. 10, 2015

(65) Prior Publication Data

US 2016/0126896 A1  May 5, 2016

Related U.S. Application Data (60) Provisional application No. 62/072,355, filed on Oct. 29, 2014, provisional application No. 62/072,973, filed on Oct. 30, 2014.

(51) Int. Cl.
*H03F 3/45* (2006.01)
*H03F 1/56* (2006.01)
(Continued)

(52) U.S. Cl.
CPC .......... *H03F 1/565* (2013.01); *H03F 1/3211* (2013.01); *H03F 1/347* (2013.01); *H03F 3/193* (2013.01); *H03F 3/195* (2013.01); *H03F 3/45071* (2013.01); *H03F 3/45188* (2013.01); *H03F 3/45475* (2013.01); *H03F 2200/294* (2013.01); *H03F 2200/301* (2013.01); *H03F 2200/451* (2013.01); *H03F 2200/54* (2013.01); *H03F 2203/21112* (2013.01); *H03F 2203/45306* (2013.01); *H03F 2203/45318* (2013.01); *H03F 2203/45386* (2013.01);
(Continued)

(58) Field of Classification Search
CPC ........................................................ H03F 3/45
USPC ................................ 330/296, 261, 253, 285
See application file for complete search history.

(56) References Cited

U.S. PATENT DOCUMENTS

| | | | |
|---|---|---|---|
| 6,756,846 B1 * | 6/2004 | Amrany | H03F 3/3022 330/146 |
| 7,068,104 B2 * | 6/2006 | Burns | H03F 1/22 330/253 |

(Continued)

OTHER PUBLICATIONS

International Search Report and Written Opinion—PCT/US2015/052904—ISA/EPO—Dec. 9, 2012.

(Continued)

*Primary Examiner* — Henry Choe
(74) *Attorney, Agent, or Firm* — Procopio, Cory, Hargreaves & Savitch LLP (57) ABSTRACT

An apparatus includes: first and second transistors, each of the first and second transistors includes a gate terminal, a source terminal, and a drain terminal; and a transformer including a primary winding and first and second secondary windings, the primary winding is coupled to a first input node configured to receive an input signal and a second input node configured to receive a potential, the first and second secondary windings are coupled to gate terminals of the first and second transistors and cross-coupled to source terminals of the first and second transistors.

22 Claims, 6 Drawing Sheets

(51) Int. Cl.
  *H03F 1/32* (2006.01)
  *H03F 1/34* (2006.01)
  *H03F 3/193* (2006.01)
  *H03F 3/195* (2006.01)
  *H04B 1/525* (2015.01)

(52) U.S. Cl.
  CPC .............. *H03F 2203/45562* (2013.01); *H03F 2203/45616* (2013.01); *H03F 2203/45621* (2013.01); *H04B 1/525* (2013.01)

(56) References Cited

U.S. PATENT DOCUMENTS

| | | | |
|---|---|---|---|
| 7,973,603 B2 * | 7/2011 | Kammula | H03F 3/45179 330/188 |
| 8,102,213 B2 | 1/2012 | Tasic et al. | |
| 8,310,312 B2 | 11/2012 | Lee et al. | |
| 8,576,005 B2 * | 11/2013 | Liao | H04B 1/52 330/253 |
| 8,577,325 B2 | 11/2013 | Lee et al. | |
| 8,614,602 B2 * | 12/2013 | Sharma | H03F 3/193 330/253 |
| 2008/0139158 A1 | 6/2008 | Chang et al. | |
| 2009/0258624 A1 | 10/2009 | Gudem et al. | |
| 2010/0259319 A1 | 10/2010 | Chan et al. | |
| 2012/0161870 A1 * | 6/2012 | Leong | H01P 5/10 330/253 |
| 2013/0281043 A1 | 10/2013 | Mu | |
| 2014/0266461 A1 | 9/2014 | Youssef et al. | |

OTHER PUBLICATIONS

Zhuo, W.; Li, X.; et al.; "A capacitor cross-coupled common-gate low-noise amplifier"; Circuits and Systems II: Express Briefs, IEEE Transactions vol. 52, Issue: 12, Dec. 2005. 5 pages.

Fabiano, I.; et al.; "SAW-Less Analog Front-End Receivers for TDD and FDD"; Solid-State Circuits, IEEE Journal vol. 48, Issue: 12, Dec. 2013. 13 pages.

* cited by examiner

TRANSFORMER FEEDBACK AMPLIFIER

CROSS-REFERENCE TO RELATED APPLICATIONS

This application claims the benefit of priority under 35 U.S.C. §119(e) of U.S. Provisional Patent Application No. 62/072,355, filed Oct. 29, 2014, entitled "Transformer Feedback Amplifier," and U.S. Provisional Patent Application No. 62/072,973, filed Oct. 30, 2014, entitled "Transformer Feedback Amplifier," The disclosure of the above-referenced application is incorporated herein by reference.

BACKGROUND

Field

This invention relates generally to low noise amplifiers, and more specifically, to transformer feedback low noise amplifiers with a linearity control.

Background

Full duplex systems, such as 1×/Wideband Code Division Multiple Access (W-CDMA), require transceiver (Rx/Tx) duplexer filters to avoid receivers from being jammed by the transmit power leakage into the receiver. In half-duplex systems such as Global System for Mobile Communications (GSM), Time Division Synchronous Code Division Multiple Access (TDS-CDMA) and Time Division Long Term Evolution (TD-LTE), the receiver (RX) Surface Acoustic Wave (SAW) filter is required to avoid receivers from being jammed or de-sensed by out-of-band blockers (as high as 0 dBm).

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

In half-duplex systems, several techniques could be employed to substantially reduce the RX SAW filter ("SAW-less") due to the absence of concurrent operation of the transmitter. This leads to substantial cost-savings for low-tier products. However, the removal of the input SAW filter causes jammers with high input levels to be present at the low noise amplifier (LNA) input. Further, the removal of the input SAW filter increases the dynamic range requirement up to 110 dB. Thus, the receiver preferably needs to tolerate very large out-of-band (OOB) interferers and requires very high OOB linearity while also meeting good sensitivity requirement. This can pose stringent requirements on the LNA and the mixer to meet very high OOB third-order intercept point (IP3) (e.g., +19.5 dBm) and high OOB second-order intercept point (IP2) (e.g., +70.0 dBm).

Accordingly, SAW-less LNA requirements are more stringent and may include: (1) a wideband match from B5 (869 MHz) to B8 (960 MHz) for low-band (LB) and from B3 (1805 MHz) to B34 (2025 MHz); (2) a differential LNA to meet LNA IP2 requirements; (3) a differential LNA having less input swing across each device, which results in better linearity (IP3, IP2); (4) a highly linear LNA to meet OOB IP3 equal to +20 dBm; (5) a high linearity (HL) mode to handle 0 dBm jammer at 20 MHz and OOB IP3 equal to 20 dBm; and (6) a low linearity (LL) mode to achieve good noise figure (NF) and sensitivity of −110 dBm when no jammers are present. However, difficulties of configuring the SAW-less LNA with separate paths for the LL and HL modes include significant differences in the impedance of the two linearity modes. Accordingly, the descriptions below can include different bias adjustments of the LL mode and HL mode LNAs to bring the impedances of the two linearity modes close to each other.

Certain embodiments of the present disclosure include: a differential LNA configuration with a transformer (or balun) feedback; a gate boosting to provide enhancement factor (A) greater than one; noise and drain distortion cancellation properties; and a negative balun feedback across gate-to-source terminals to linearize the LNA as compared to a standalone amplifier. In one embodiment, two different LNA architectures are configured to implement an LNA that is high linearity (HL) and low NF depending on the presence or absence of jammers. For example, the LNA is configured operate in a low linearity (LL) mode when jammers are not present, while the LNA is configured to operate in a higher linearity (HL) mode when jammers are present. The detailed description set forth below is intended as a description of exemplary designs of the present disclosure and is not intended to represent the only designs in which the present disclosure can be practiced.

The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and the like. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband- CDMA (W-CDMA), or some other standards. An OFDM system may implement Institute of Electrical and Electronics Engineers (IEEE) 802.11 (Wireless Local Area Network (WLAN)), IEEE 802.16 (Worldwide Interoperability for Microwave Access (WiMAX)), Long Term Evolution (LTE) (e.g., in time division duplex (TDD) and/or frequency division duplex (FDD) modes), or some other standards. A TDMA system may implement Global System for Mobile Communications (GSM) or some other standards. These various standards are known in the art. The techniques described herein may also be implemented in any of various other suitable wireless systems using radio frequency (RF) technology, including Global Navigation Satellite System (GNSS), Bluetooth, IEEE 802.15 (Wireless Personal Area Network (WPAN)), Near Field Communication (NFC), Small Cell, Frequency Modulation (FM), and the like.

Figure 1:
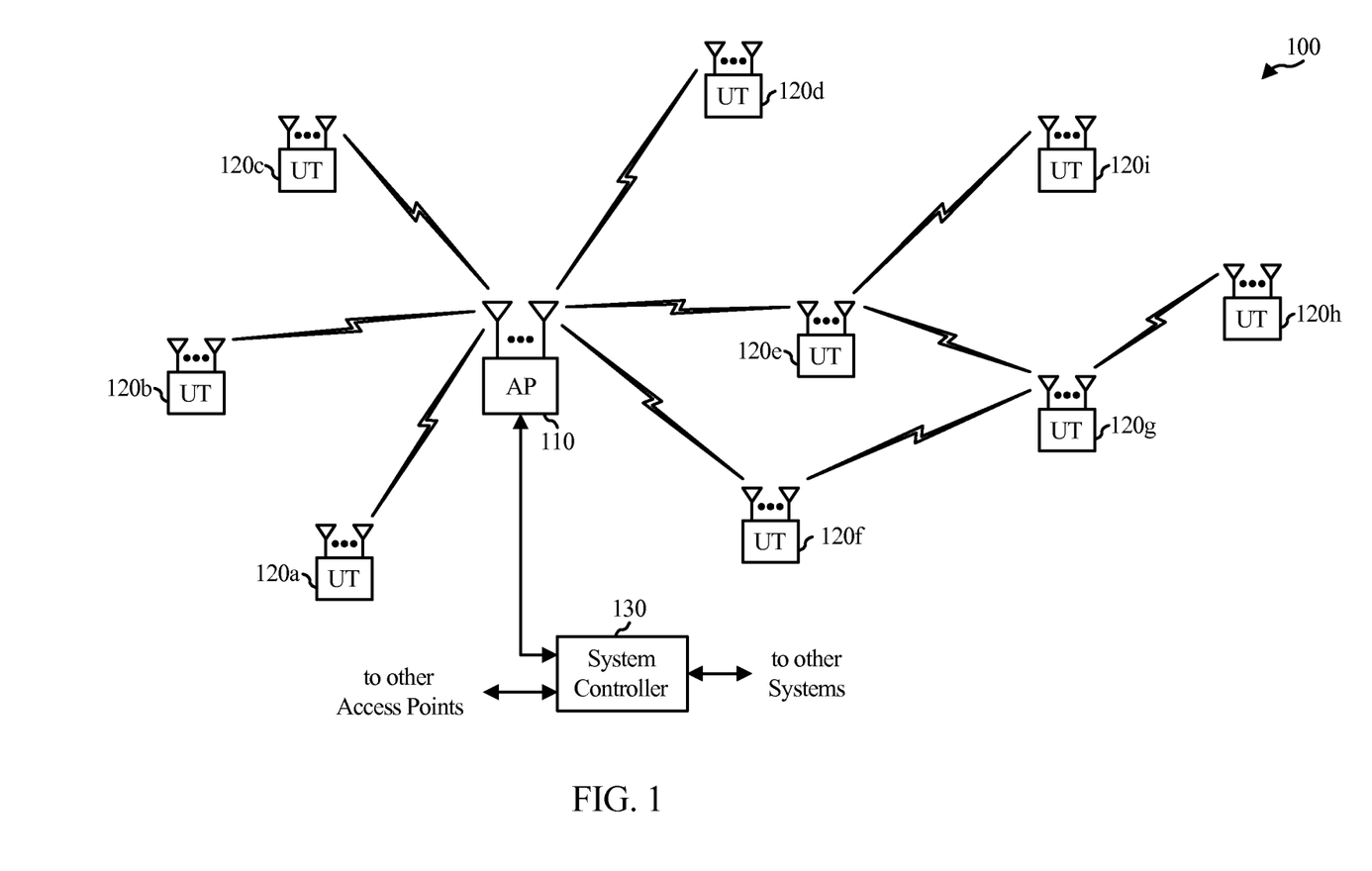
FIG. 1 illustrates an exemplary wireless communications system with access points and user terminals.

FIG. 1 illustrates an exemplary wireless communications system 100 with access points and user terminals. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink may share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
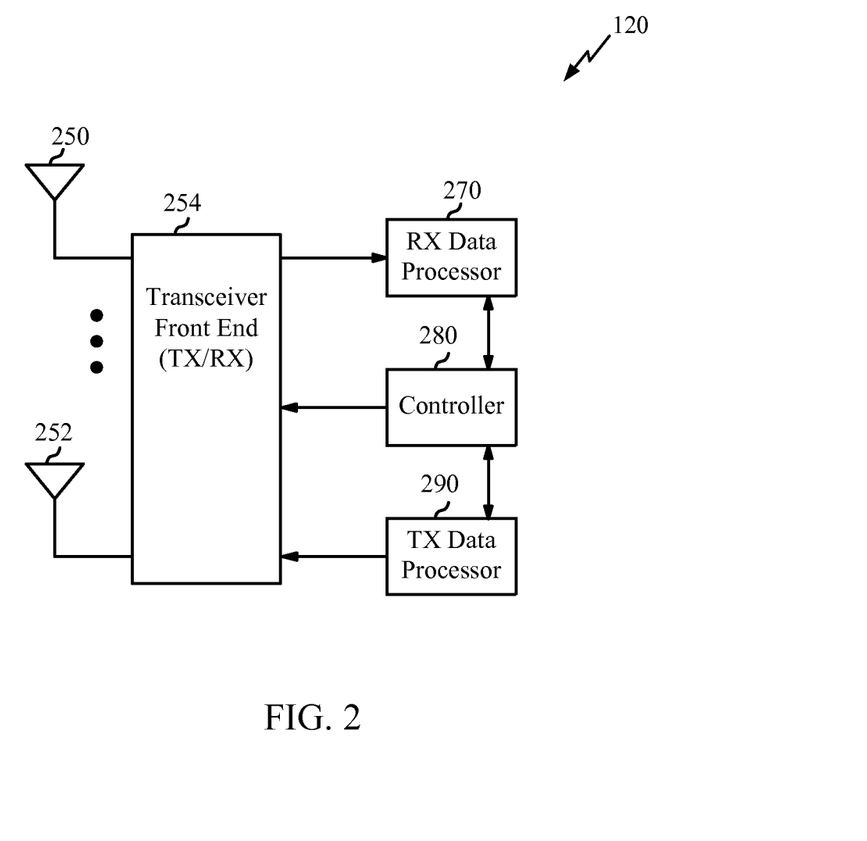
FIG. 2 shows a block diagram of an exemplary user terminal in the wireless communication system.

FIG. 2 shows a block diagram of an exemplary user terminal 120 in the wireless communication system 100. In the illustrated embodiment of FIG. 2, the user terminal 120 includes antennas 250, 252, a transceiver front end (TX/RX) 254, an RX data processor 270, a controller 280, and a TX data processor 290.

Figure 3:
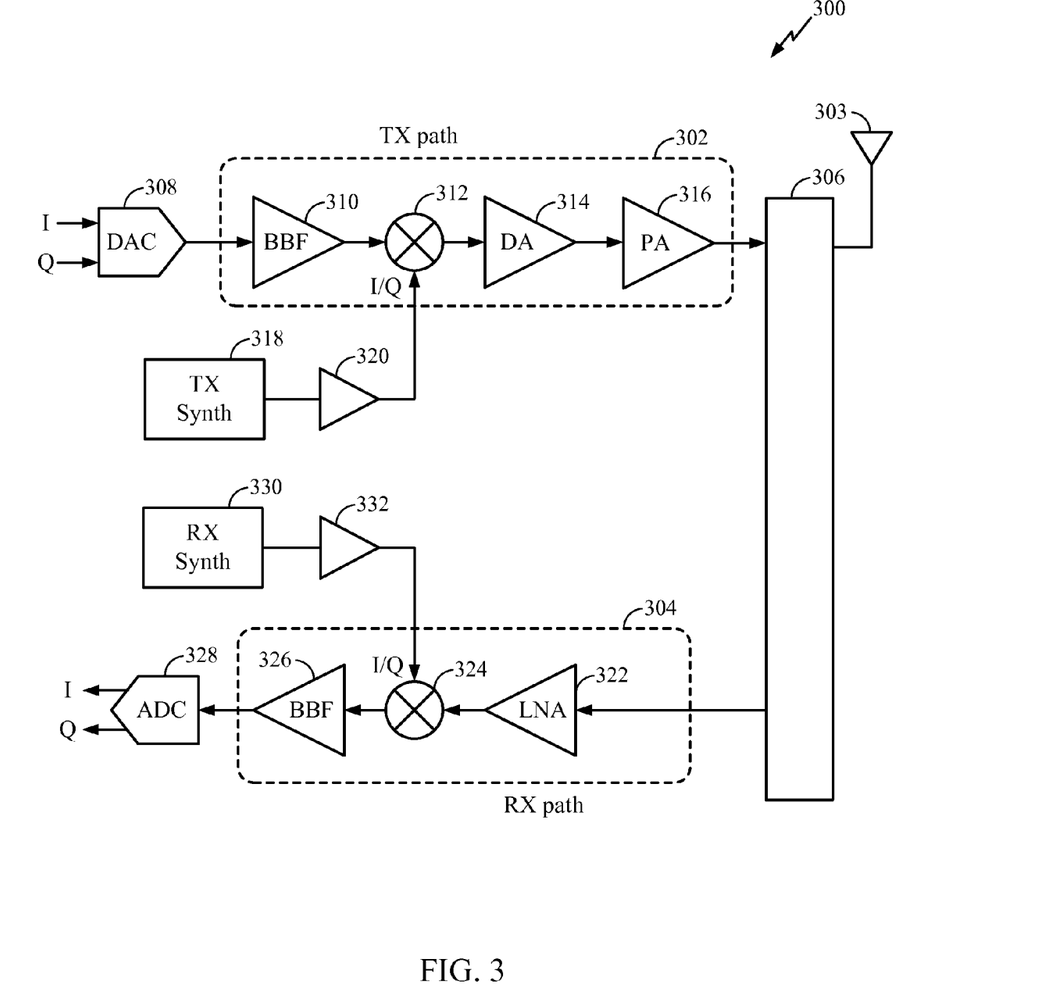
FIG. 3 is a block diagram of an example transceiver front end, such as transceiver front ends in FIG. 2, in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a BBF 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

Figure 4A:
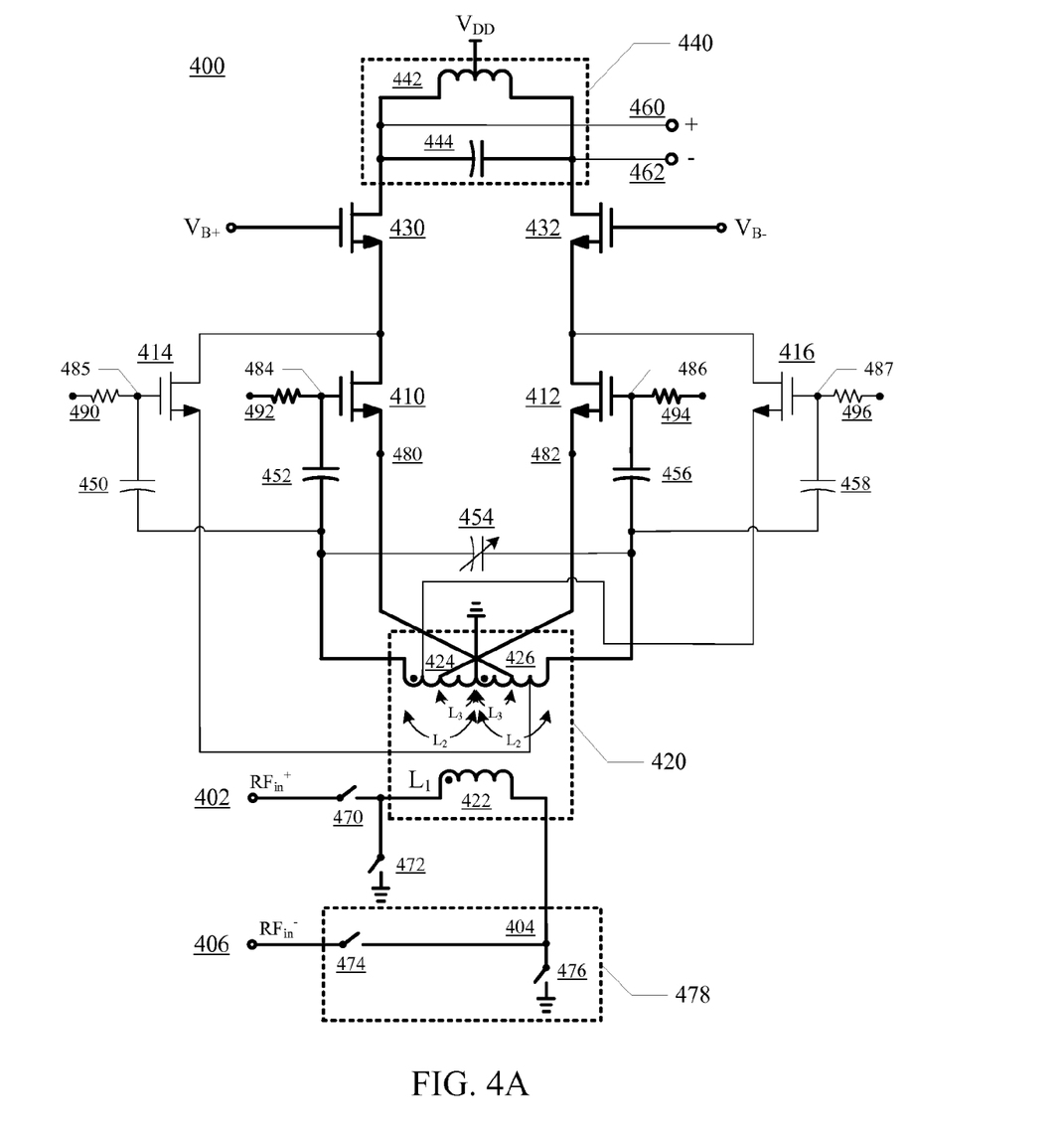
FIG. 4A is a schematic diagram of an exemplary low noise amplifier (LNA) in accordance with one embodiment of the present disclosure.

FIG. 4A is a schematic diagram of an exemplary LNA 400 in accordance with one embodiment of the present disclosure. In one embodiment, the LNA 400 is used in the RX path 304 of the transceiver front end 300 shown in FIG. 3 as LNA 322. As stated above, the LNA 400 is configured as a differential LNA with a transformer feedback. Further, the configuration of LNA 400 comprises two different LNA architectures to implement an LNA that provides high linearity (HL) and low noise figure (NF) or low linearity (LL) depending on the presence or absence of jammers. For example, the LNA is configured in an LL mode when jammers are not present, while the LNA is configured in an HL mode when jammers are present. FIG. 4A illustrates the LNA 400 with components used in the LL mode highlighted in bold/thick lines. In one embodiment, determining, processing, and controlling of the LNA 400 in the LL mode or HL mode are performed by a processor/controller (similar to controller 280 shown in FIG. 2).

In the illustrated embodiment of FIG. 4A, the LNA 400 includes a single-ended RF input node 402, an input balun or transformer 420, input transistors 410, 412, 414, 416, a pair of cascode transistors 430, 432 to provide a differential bias signal, a load 440 including an inductor 442 and a capacitor 444, and a pair to differential output nodes 460, 462. In this embodiment, the transformer is configured as means for transferring energy. In FIG. 4A, the input balun or transformer 420 is configured with a primary inductor winding 422 and a pair of secondary inductor windings 424, 426 (a plurality of secondary windings in general), each secondary inductor winding 424, 426 having at least one tap. The positive RF input signal (RF in⁺) 402 is coupled to the first terminal of the primary inductor winding 422. The second terminal of the primary inductor winding 422 is coupled to the ground or the negative RF input signal (RF in using a switch network 478. Switch 470 enables or disables the connection of RF input node 402 to the primary inductor winding 422. Switch 472 provides better isolation when switch 470 is disabled.

Transconductance-boosted (gm-boosted) LNA decouples the tight link between noise figure (noise match) and input match (power match). Consequently, the noise figure and current consumption can be simultaneously reduced. For a negative feedback factor of "A" across the gate-source terminal of a common-gate (CG) LNA, the effective transconductance (gm) is boosted by a factor of (1+A) and the noise figure is reduced by the same factor. The embodiment shown in FIG. 4A realizes the gm boosting through negative transformer feedback as shown in Equation (1) below:

$$A = k\sqrt{\frac{L_2}{L_3}} \quad (1)$$

In Equation (1), the inductance of secondary windings 424 and 426 is denoted as $L_2$, while the inductance between node 480 and ground terminal is denoted as $L_3$. Similarly, the inductance between node 482 and ground terminal is denoted as $L_3$. The magnetic coupling factor between inductances $L_2$ and $L_3$ is denoted by k. Since the gm boosting factor A depends on the square root of the ratio of L2 to L3, it can be designed to have a value greater than unity like the capacitor-cross-coupled CG LNA where the gm boosting factor is always less than unity. Further, this boosting factor is independent of process and temperature variations.

One of the terminals of each of the pair of secondary inductor windings 424, 426 is coupled to the ground, while the other terminals of the secondary inductor windings 424, 426 are coupled to the gate terminals 484, 486 of the pair of differential transistors 410, 412 through capacitors 452, 456, respectively. A tunable capacitor 454 is coupled across the gate terminals 484, 486 of the pair of differential transistors 410, 412 to resonate at a wanted RF frequency, thus providing bandpass filtering. The source terminals 480, 482 of the pair of differential transistors 410, 412 are coupled to the taps (e.g., center taps) of the secondary inductor windings 426, 424, respectively. Thus, connections from the source terminals 480, 482 to the gate terminals 484, 486 of the pair of differential transistors 410, 412 through the secondary inductor windings 424, 426 provide gm boosting via negative transformer feedback, thus, improving the noise figure of the LNA in the LL mode. It should be noted that the transformer feedback is negative in polarity. That is, the feedback is routed from the source terminal 480 of the transistor 410 to the gate terminal 486 of the transistor 412 through the tap of the secondary winding 426, while the feedback is routed from the source terminal 482 of the transistor 412 to the gate terminal 484 of the transistor 410 through the tap of the secondary winding 424. In this configuration, the transistors 410, 412 are operating as means for amplifying.

Figure 4B:
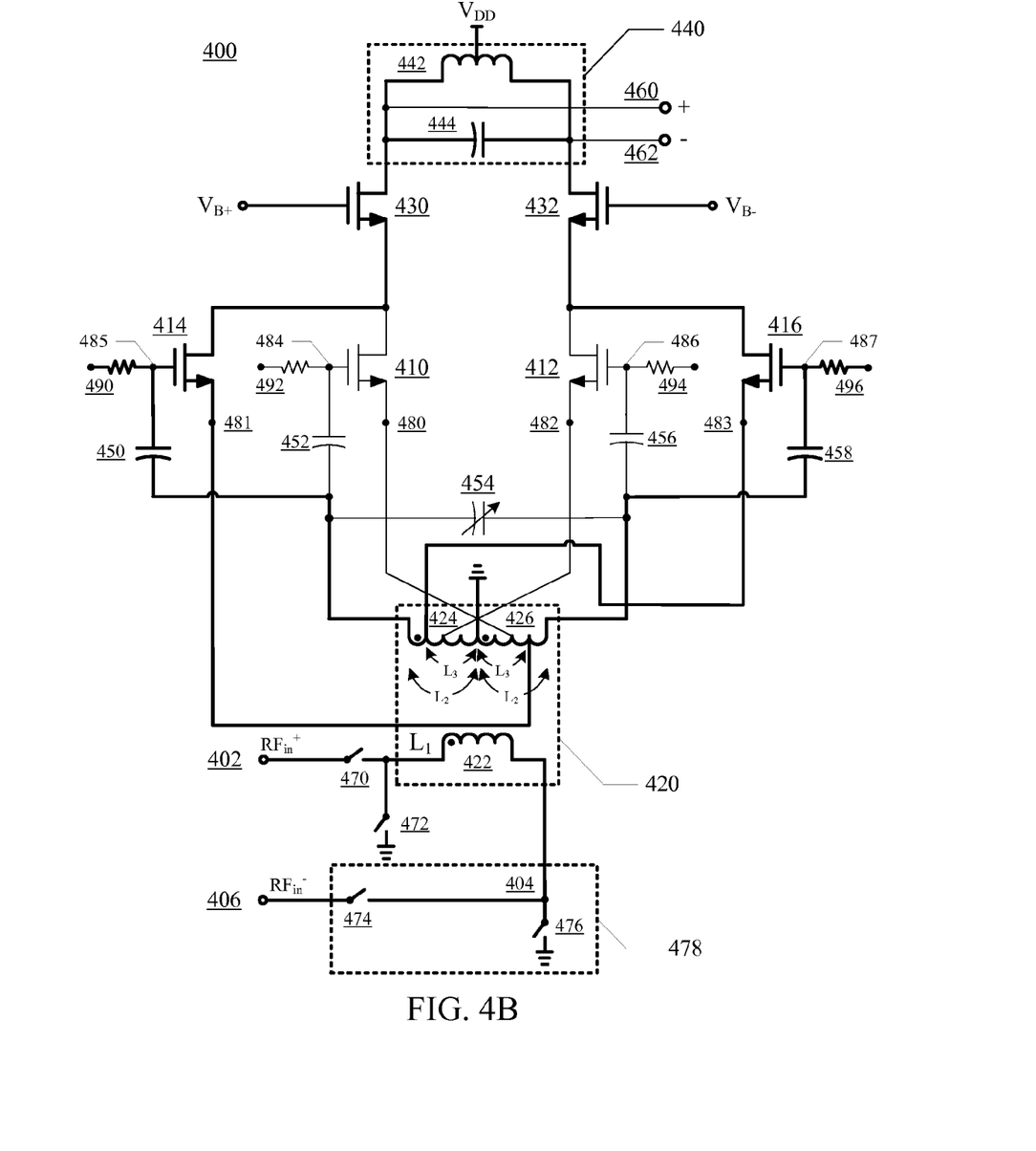
FIG. 4B is a schematic diagram of an exemplary LNA in accordance with another embodiment of the present disclosure.

FIG. 4B is a schematic diagram of an exemplary LNA 400 in accordance with another embodiment of the present disclosure. FIG. 4B illustrates the LNA 400 with components used in the HL mode highlighted in bold/thick lines.

In the illustrated embodiment of FIG. 4B, the input balun or transformer 420 is configured with a primary inductor winding 422 and a pair of secondary inductor windings 424, 426, each secondary inductor winding 424, 426 having at least one tap. One of the terminals of each of the pair of secondary inductor windings 424, 426 is coupled to the ground, while the other terminals of the secondary inductor windings 424, 426 are coupled to the gate terminals 485, 487 of the pair of differential transistors 414, 416 through capacitors 450, 458, respectively. A tunable capacitor 454 is coupled across the gate terminals 485, 487 of the pair of differential transistors 414, 416 to resonate at a wanted RF frequency. The source terminals 481, 483 of the pair of differential transistors 414, 416 are coupled to the taps of the secondary inductor windings 426, 424, respectively. Thus, connections from the source terminals 481, 483 to the gate terminals 485, 487 of the pair of differential transistors 414, 416 through the secondary inductor windings 424, 426 provide negative transformer feedback which helps to improve the linearity of the LNA 400 in the HL mode due to more source degeneration inductance to ground and less gm boosting (i.e., while A is always >1, it is smaller in magnitude in HL mode as compared to that in LL mode). In this configuration, the transistors 414, 416 are operating as means for amplifying.

The RF input signal can be configured as a differential signal with node 402 configured as a positive input terminal to input a positive RF input signal and node 404 configured as a negative input terminal to input a negative RF input signal. FIGS. 4A and 4B show the RF input signal as a differential signal with node 402 receiving a positive RF input while node 406 is receiving a negative RF input. Thus, in this configuration, node 406 is configured to couple to a switch network 478 allowing the RF input to be switched between a single-ended input and a differential input. For example, in one configuration, when switch 474 is open and switch 476 is closed, the RF input signal is configured as a single-ended input signal with the input at node 402 and node 404 grounded. Thus, a potential at node 404 can be a negative RF input signal or ground voltage. In another configuration, when switch 474 is closed and switches 472, 476 are open, the RF input signal is configured as a differential input signal with the input signal received at node 402 being a positive RF input and the input signal received at node 406 being a negative RF input.

In FIG. 4A, which is configured for the LL mode, the amount of transformer feedback is adjusted for a smaller tap position in the secondary inductor windings 424, 426 than the HL mode shown in FIG. 4B. The adjustment of the transformer feedback for a smaller tap position in the LL mode configures the LNA 400 like a common-source configuration where A is high, while the adjustment of the transformer feedback for a larger tap position in the HL mode configures the LNA 400 like a common-gate configuration where A is lower as compared to LL mode (while still greater than 1).

In one embodiment, the configuration of the LNA 400 for the LL mode shown in FIG. 4A is enabled by biasing the gate terminals 484, 486 of the differential transistors 410, 412 to activate them using bias resistors 492, 494, while the gate terminals 485, 487 of the differential transistors 414, 416 are biased to de-activate them using bias resistors 490, 496. In contrast, the configuration of the LNA 400 for the HL mode shown in FIG. 4B is enabled by biasing the gate terminals 485, 487 of the differential transistors 414, 414 to activate them using bias resistors 490, 496, while the gate terminals 484, 486 of the differential transistors 410, 412 are biased to de-activate them using bias resistors 492, 494. Due to different feedback factor (A) in LL mode versus HL mode, the LNA input impedance changes significantly between LL mode versus HL mode. Since the external LNA input match is common between the two modes, it is desirable to bring the impedances of LL mode and HL mode closer to each other on an impedance plane (e.g., a Smith chart), which can be achieved by the alternative embodiment described below.

In an alternative embodiment, the configuration of the LNA 400 for the LL mode shown in FIG. 4A is enabled by biasing the gate terminals 484, 486 of the differential transistors 410, 412 to activate them using bias resistors 492, 494, while the gate terminals 485, 487 of the differential transistors 414, 416 are also biased to activate them at a low bias current using bias resistors 490, 496. For example, the low biasing of the differential transistors 414, 416 (rather than biasing them off) in the LL mode is configured to provide 2% bleed current and improve the LL mode impedance and bring the impedance of the LL mode closer to the HL mode. Further, the configuration of the LNA 400 for the HL mode shown in FIG. 4B is enabled by biasing the gate terminals 485, 487 of the differential transistors 414, 414 to activate them using bias resistors 490, 496, while the gate terminals 484, 486 of the differential transistors 410, 412 are also biased to activate them at a low bias current using bias resistors 492, 494. For example, the low biasing of the differential transistors 410, 412 (rather than biasing them off) in the HL mode is configured to provide 0% to 2% bleed current and improve the HL mode impedance and bring the impedance of the HL mode closer to the LL mode.

All transistors 410, 412, 414, 416, 430, 432 in FIGS. 4A and 4B are configured as n-channel type metal oxide semiconductor field effect transistors (n-MOSFETs). However the transistors 410, 412, 414, 416, 430, 432 can be configured as p-channel type MOSFETs or as bipolar transistors. Transistors 410, 412, 414, 416 are also referred to as main transistors and transistors 430, 432 are referred to as cascode or bias transistors. Inductors 422, 424, 426, 442 and capacitors 450, 452, 454, 456, 458, 444 are integrated components formed the on the LNA 400 using semiconductor fabrication processes.

Figure 5A:
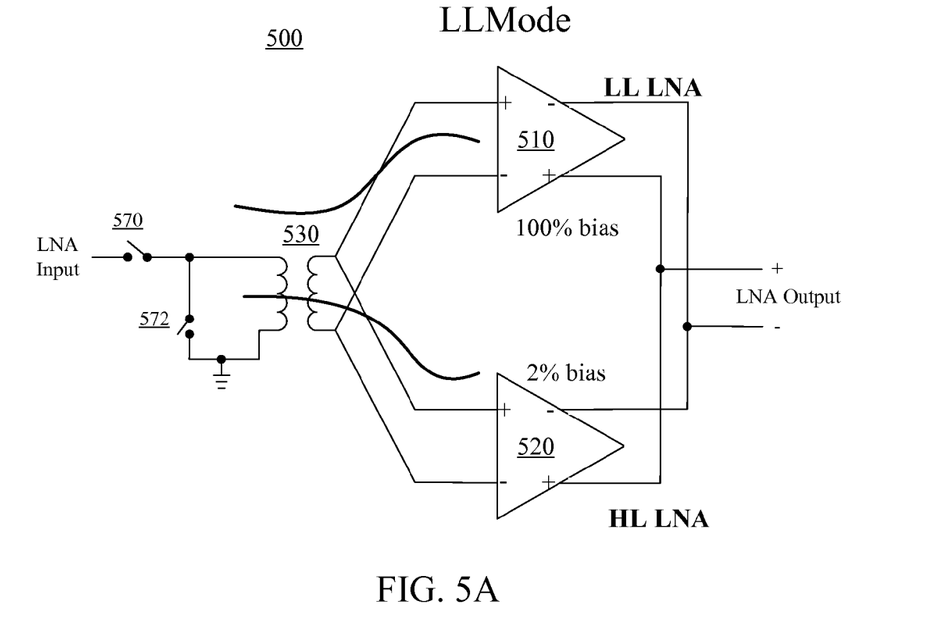
FIG. 5A is a schematic diagram of an exemplary LNA configured in a low linearity mode in accordance with an alternative embodiment of the present disclosure.

FIG. 5A is a schematic diagram of an exemplary LNA 500 configured in a low linearity mode in accordance with an alternative embodiment of the present disclosure. The LNA 500 includes a plurality of amplifiers 510, 520 wherein each amplifier 510 or 520 is configured for a different linearity mode for better matching of the impedance. For example, amplifier 510 is used for a low linearity mode, while amplifier 520 is used for a high linearity mode. In the low linearity mode of FIG. 5A, LL amplifier 510 is substantially biased (close to 100% biasing), while HL amplifier 520 is biased to bleed or discharge small amount of bias current (e.g., 2%). This improves the LL mode impedance and brings it closer to the HL mode impedance. As before, the LNA input is coupled to a transformer 530 at its first terminal of the primary winding. The second terminal of the primary winding is coupled to the ground. Switch 570 enables or disables the connection of LNA input (at an input node) to the primary winding. Switch 572 provides better isolation when switch 570 is disabled.

Figure 5B:
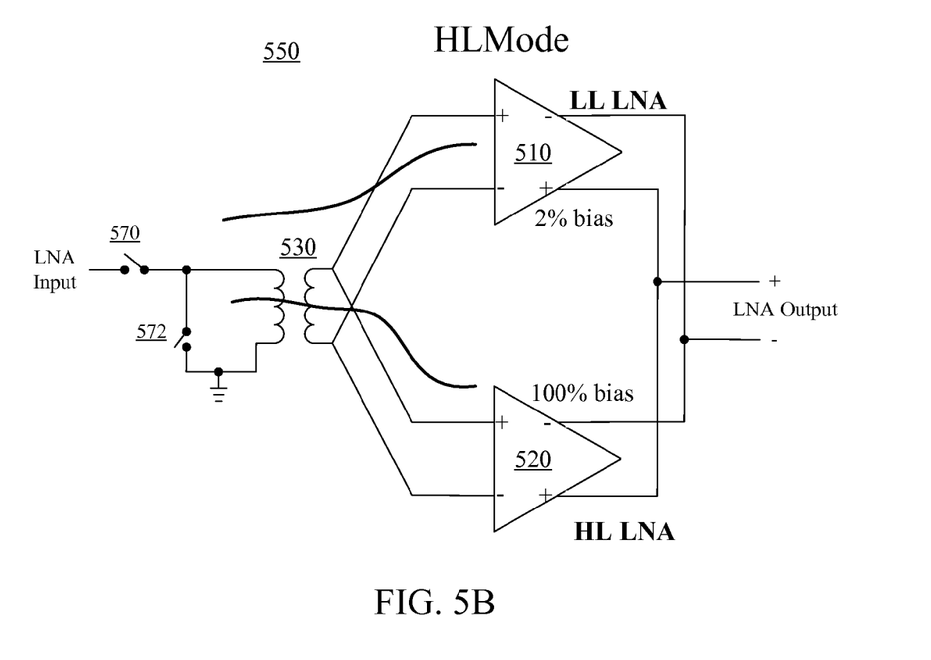
FIG. 5B is a schematic diagram of an exemplary LNA configured in a high linearity mode in accordance with another alternative embodiment of the present disclosure.

FIG. 5B is a schematic diagram of an exemplary LNA 550 configured in a high linearity mode in accordance with another alternative embodiment of the present disclosure. In FIG. 5B, the LNA 550 includes amplifier 510 used for a low linearity mode and amplifier 520 used for a high linearity mode. Thus, in the high linearity mode of FIG. 5B, HL amplifier 520 is substantially biased (close to 100% biasing), while LL amplifier 510 is biased to bleed or discharge small amount of bias current (e.g., 2%). This improves the HL mode impedance and brings it closer to the LL mode impedance.

Transceiver front ends and LNAs described herein may be implemented on an IC, an analog IC, an RFIC, a mixed-signal IC, an application-specific integrated circuit (ASIC), a printed circuit board (PCB), an electronic device, etc. The transceiver front ends and LNAs described may also be fabricated with various integrated circuit process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the transceiver front ends and LNAs described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   first and second transistors, each of the first and second transistors includes a gate terminal, a source terminal, and a drain terminal;
   a transformer including a primary winding and first and second secondary windings,
   the primary winding is coupled to a first input node configured to receive an input signal and a second input node configured to receive a potential,
   the first and second secondary windings are coupled to gate terminals of the first and second transistors and cross-coupled to source terminals of the first and second transistors; and
   a first switch disposed between the first input node and a first input terminal of the primary winding, the first switch configured to pass the input signal to the first input terminal of the primary winding.

2. The apparatus of claim 1, further comprising:
   first and second bias resistors coupled to the gate terminals of the first and second transistors, respectively; and
   a controller configured to bias the first and second transistors into a low linearity mode using the first and second bias resistors.

3. The apparatus of claim 1, the first secondary winding is coupled to the gate terminal of the first transistor and the source terminal of the second transistor, and second secondary winding is coupled to the source terminal of the first transistor and the gate terminal of the second transistor.

4. The apparatus of claim 1, further comprising
   third and fourth transistors coupled to the first and second transistors, each of the third and fourth transistors includes a gate terminal, a source terminal, and a drain terminal.

5. The apparatus of claim 4, the drain terminal of the third transistor is coupled to the drain terminal of the first transistor and the drain terminal of the fourth transistor is coupled to the drain terminal of the second transistor.

6. The apparatus of claim 4, the first and second secondary windings are coupled to gate terminals of the third and fourth transistors and cross coupled to source terminals of the third and fourth transistors.

7. The apparatus of claim 4, further comprising:
   third and fourth bias resistors coupled to the gate terminals of the third and fourth transistors, respectively; and
   a controller coupled to the third and fourth bias resistors and configured to bias the third and fourth transistors into a high linearity mode.

8. The apparatus of claim 4, further comprising
   a variable capacitor coupled to the gate terminals of the first, second, third, and fourth transistors.

9. The apparatus of claim 1, further comprising
   a second switch disposed between the first input terminal of the primary winding and a ground voltage, the second switch configured to short the first input terminal of the primary winding.

10. The apparatus of claim 1, further comprising
    a third switch disposed between the second input node and a second input terminal of the primary winding, the third switch configured to pass the potential that is a negative signal with respect to the input signal to form a differential signal with the input signal.

11. The apparatus of claim 10, further comprising
    a fourth switch disposed between the second input terminal of the primary winding and a ground voltage, the fourth switch configured to short the second input terminal of the primary winding.

12. The apparatus of claim 1, further comprising:
    third and fourth transistors coupled to the first and second transistors; and
    a controller configured to substantially bias the first and second transistors into a low linearity mode and bias the third and fourth transistors to discharge a small amount of bias current during the low linearity mode.

13. The apparatus of claim 1, further comprising:
    third and fourth transistors coupled to the first and second transistors; and
    a controller configured to substantially bias the third and fourth transistors into a high linearity mode and bias the first and second transistors to discharge a small amount of bias current during the high linearity mode.

14. An apparatus comprising:
    first and second means for amplifying, each of the first and second means for amplifying includes at least an input terminal and an output terminal;
    means for receiving an input signal and a potential;
    means for transferring energy including a primary winding and first and second secondary windings,
    the primary winding coupled to the means for receiving an input signal and the means for receiving a potential,
    the first and second secondary windings are coupled to input terminals of the first and second means for amplifying and cross-coupled to output terminals of the first and second means for amplifying; and
    third and fourth means for amplifying coupled to the first and second means for amplifying, each of the third and fourth means for amplifying includes an input terminal and an output terminal,
    wherein the first and second secondary windings are also coupled to input terminals of the third and fourth means for amplifying and cross-coupled to output terminals of the third and fourth means for amplifying.

15. The apparatus of claim 14, further comprising
    means for biasing the first and second means for amplifying into a low linearity mode.

16. The apparatus of claim 14, further comprising
    means for controlling configured to substantially bias the first and second means for amplifying into a low linearity mode and bias the third and fourth means for amplifying to discharge a small amount of bias current during the low linearity mode.

17. The apparatus of claim 14, further comprising
    means for controlling configured to substantially bias the third and fourth means for amplifying into a high linearity mode and bias the first and second means for amplifying to discharge a small amount of bias current during the high linearity mode.

18. An apparatus comprising:
    first and second transistors, each of the first and second transistors includes a gate terminal, a source terminal, and a drain terminal;
    a transformer including a primary winding and first and second secondary windings,
    the primary winding is coupled to a first input node configured to receive an input signal and a second input node configured to receive a potential, the first and second secondary windings are coupled to gate terminals of the first and second transistors and cross-coupled to source terminals of the first and second transistors; and third and fourth transistors coupled to the first and second transistors, each of the third and fourth transistors includes a gate terminal, a source terminal, and a drain terminal, the first and second secondary windings are coupled to gate terminals of the third and fourth transistors and cross coupled to source terminals of the third and fourth transistors.

19. The apparatus of claim 18, further comprising:

first and second bias resistors coupled to the gate terminals of the first and second transistors, respectively; and a controller configured to bias the first and second transistors into a low linearity mode using the first and second bias resistors.

20. The apparatus of claim 18, the drain terminal of the third transistor is coupled to the drain terminal of the first transistor and the drain terminal of the fourth transistor is coupled to the drain terminal of the second transistor.

21. The apparatus of claim 18, further comprising:

third and fourth bias resistors coupled to the gate terminals of the third and fourth transistors, respectively; and a controller coupled to the third and fourth bias resistors and configured to bias the third and fourth transistors into a high linearity mode.

22. The apparatus of claim 18, further comprising a variable capacitor coupled to the gate terminals of the first, second, third, and fourth transistors.

* * * * *